US00RE41926E

(19) United States
(12) Reissued Patent
Lee

(10) Patent Number: US RE41,926 E
(45) Date of Reissued Patent: Nov. 16, 2010

(54) OUTPUT CIRCUIT FOR ADJUSTING OUTPUT VOLTAGE SLEW RATE

(75) Inventor: An-Ming Lee, Hsinchu County (TW)

(73) Assignee: Realtek Semiconductor Corp., Hsinchu (TW)

(21) Appl. No.: 11/223,913

(22) Filed: Sep. 9, 2005

Related U.S. Patent Documents

Reissue of:
(64) Patent No.: 6,617,897
Issued: Sep. 9, 2003
Appl. No.: 10/256,669
Filed: Sep. 27, 2002

(30) Foreign Application Priority Data

Oct. 3, 2001 (TW) ..... 90124468 A

(51) Int. Cl.
*H03K 5/12* (2006.01)

(52) U.S. Cl. ..... 327/170; 327/112; 327/134; 327/379; 327/380; 327/381; 327/389; 327/390; 327/391; 326/82; 326/83

(58) Field of Classification Search ..... 327/108, 327/111, 112, 170, 134, 379, 380, 381, 389, 327/390, 391; 326/82, 83, 86
See application file for complete search history.

(56) References Cited

U.S. PATENT DOCUMENTS 3,868,519 A 2/1975 Green ..... 327/170
5,126,588 A 6/1992 Reichmeyer et al. ..... 327/108
5,128,631 A 7/1992 Feliz et al. ..... 330/255
5,317,206 A 5/1994 Hanibuchi et al. ..... 327/170
5,973,512 A 10/1999 Baker ..... 326/87
6,002,637 A * 12/1999 Kim ..... 365/230.08
6,271,699 B1 8/2001 Dowlatabadi ..... 327/170
6,433,592 B1 * 8/2002 Ehben ..... 327/108

* cited by examiner

*Primary Examiner*—Ryan C Jager
(74) *Attorney, Agent, or Firm*—Thomas, Kayden, Horstemeyer & Risley, LLP

(57) ABSTRACT

The present invention discloses an output circuit that is able to adjust the output voltage slew rate and avoid short-circuit current, comprising: a control circuit for receiving an input data and generating a first set of control signals based on the input data; an output control device consisting of a first field effect transistor (FET) connected in series with a second field effect transistor (FET) and the point of connection is the output end for generating an output signal; a first capacitor having one end connected to a first working voltage and generates a first control voltage by charging/discharging on another end to control the gate of the first field effect transistor; a first switch for controlling charging/discharging of the first capacitor device based on the first set of control signals; a first current source for providing charging current for the first capacitor device; a second capacitor having one end connected to a second working voltage and generates a second control voltage by charging/discharging on another end to control the gate of the second field effect transistor; a second switch for controlling charging/discharging of the second capacitor device based on the first set of control signal; and a second current source providing charging current for the second capacitor device. The present invention adjusts output voltage slew rate of the output circuit by adjusting the time constant of the first and second capacitor devices.

20 Claims, 9 Drawing Sheets

OUTPUT CIRCUIT FOR ADJUSTING OUTPUT VOLTAGE SLEW RATE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention generally relates to an output circuit which is able to adjust output voltage slew rate and output current and avoid short-circuit current. The output circuit of the present invention can apply in many different application for circuit restricted by output voltage slew rate; such as USB, to assure the properties of circuit comply with required specification.

2. Description of the Prior Art

Generally speaking, the signal of a circuit can be output from a simple inverter set 10; as shown in FIG. 1, which is serially connected with stage 11, stage 12, and so on to stage IN. The output circuit of such kind is pretty simple and fewer components arc required, which is very suitable for low speed, low cost application. However, the output voltage slew rate of the output circuit characteristic of these "simple" inverters is determined by the parasitic capacitor and the loading capacitor and is difficult to be adjusted by a user with simple method. Thus, in the situation that output signal is with high speed and high amplitude, the electromagnetic interference easily occurs, which seriously impacts the operation of the circuit.

Therefore, some restriction will be required for the output voltage slew rate for the application that the high-speed output signal and the electromagnetic interference should be put into consideration. As shown in FIG. 2, the U.S. Pat. No. 5,598,119 "Method and apparatus for a load adaptive pad driver" is showing how to do so. It is apparent that, with the control over the output voltage of PMOS and NMOS, the output voltage slew rate will be adjusted properly. In FIG. 2, the output circuit 20 generates slope signal with the slope generators 21 and 22, and the output voltage of PMOS and NMOS will be controlled properly by the comparators 24 and 25. So, the output voltage slew rate will be under control by controlling the slope of the slope signal generated by the slope generators 21 and 22. However, since the comparators 24 and 25 consist of OP, the change of the output voltage of PMOS and NMOS is limited by the bandwidth and the output voltage slew rate of OP. When the slope signal input to OP is with higher slope, the output voltage of OP will probably generate ripple, or even cause OP unstable.

Besides the problem associated with output voltage slew rate, the output circuit 20 also comes with short-circuit current problem. When the output voltage of the output driver 22 reaches the half of the output amplitude, PMOS and NMOS will conduct simultaneously, and which cause the circuit system to suffer short-circuit current problem that large amount of current coming through suddenly. The problem not only causes the large amount of current extremely increase all of a sudden but also creates large amount of heat, which seriously impacts the quality and the life of the circuit. Therefore, a well-designed output circuit shall take the two major issues above into account and provide better solutions thereof.

SUMMARY OF THE INVENTION

Accordingly, it is the primary object of the present invention to provide an output circuit which is able to adjust output voltage slew rate and avoid short-circuit current.

It is another object of the present invention to provide an output circuit which is able to adjust output voltage slew rate and output current simultaneously and avoid short-circuit current.

In order to achieve the foregoing object, the present invention provides an output circuit for adjusting output voltage slew rate and avoiding short-circuit current, comprising: a control circuit, for receiving an input data and generating a first set of control signal based on the input data; a output control device for generating output signal, which is consisting of a first field effect transistor (FET) connected in series with a second field effect transistor (FET) and the point of connection is the output end; a first capacitor device which is with one end connected to a first working voltage and with another end charging/discharging to generate a first control voltage to control the gate of the first field effect transistor; a first switch for controlling charging and discharging of the first capacitor device based on the first set of control signal; a first current source for providing charging current for the first capacitor device; a second capacitor device which is with one end connected to a second working voltage and with another end charging/discharging to generate a second control voltage to control the gate of the second field effect transistor; a second switch for controlling charging and discharging of the second capacitor device based on the first set of control signal; and a second current providing charging current for the second capacitor device.

Therefore, the present invention is able to adjust the output voltage slew rate of the output circuit by controlling the time constant of the first capacitor device and the second capacitor device.

The output circuit for adjusting output voltage slew rate of the present invention further comprises a third field effect transistor (FET) and a fourth -field effect transistor (FET). The gate and the drain of the third field effect transistor are connected to the gate of the first field effect transistor in order to control the output current of the first field effect transistor, and the gate and the drain of the fourth field effect transistor are connected to the gate of the second field effect transistor to control the output current of the second field effect transistor.

Therefore, in the present invention, by adjusting the aspect ratio of the first field effect transistor to the third field effect transistor and the aspect ratio of the second field effect transistor to the fourth field effect transistor, the output current of the output control device will be under controlled.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an output circuit for adjusting output voltage slew rate can be exemplified by the preferred embodiment as described hereinafter.

Figure 1:
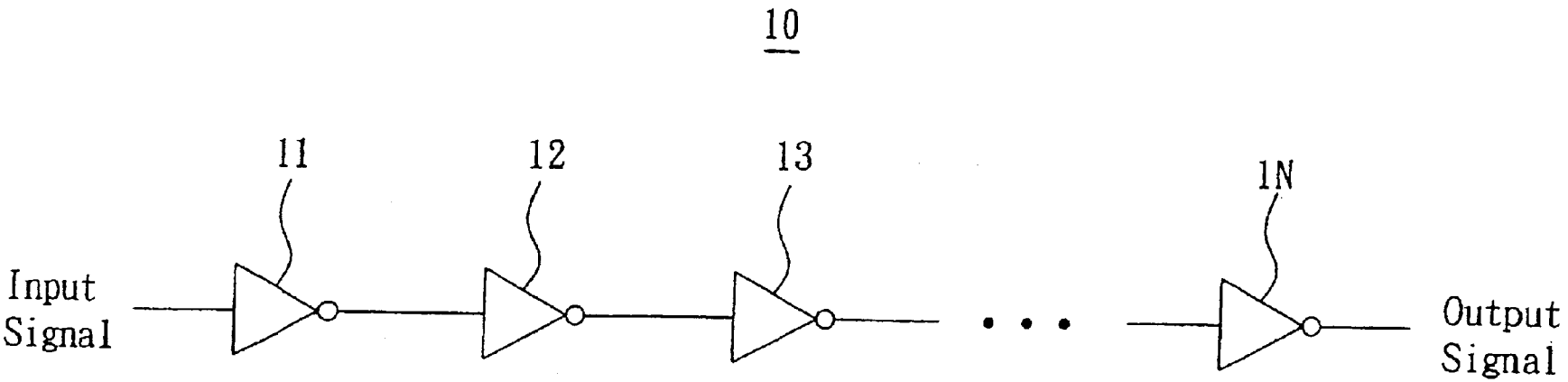
FIG. 1 (PRIOR ART)
FIG. 1 is a schematic block diagram showing a conventional output control circuit in accordance with the prior art.
Figure 2:
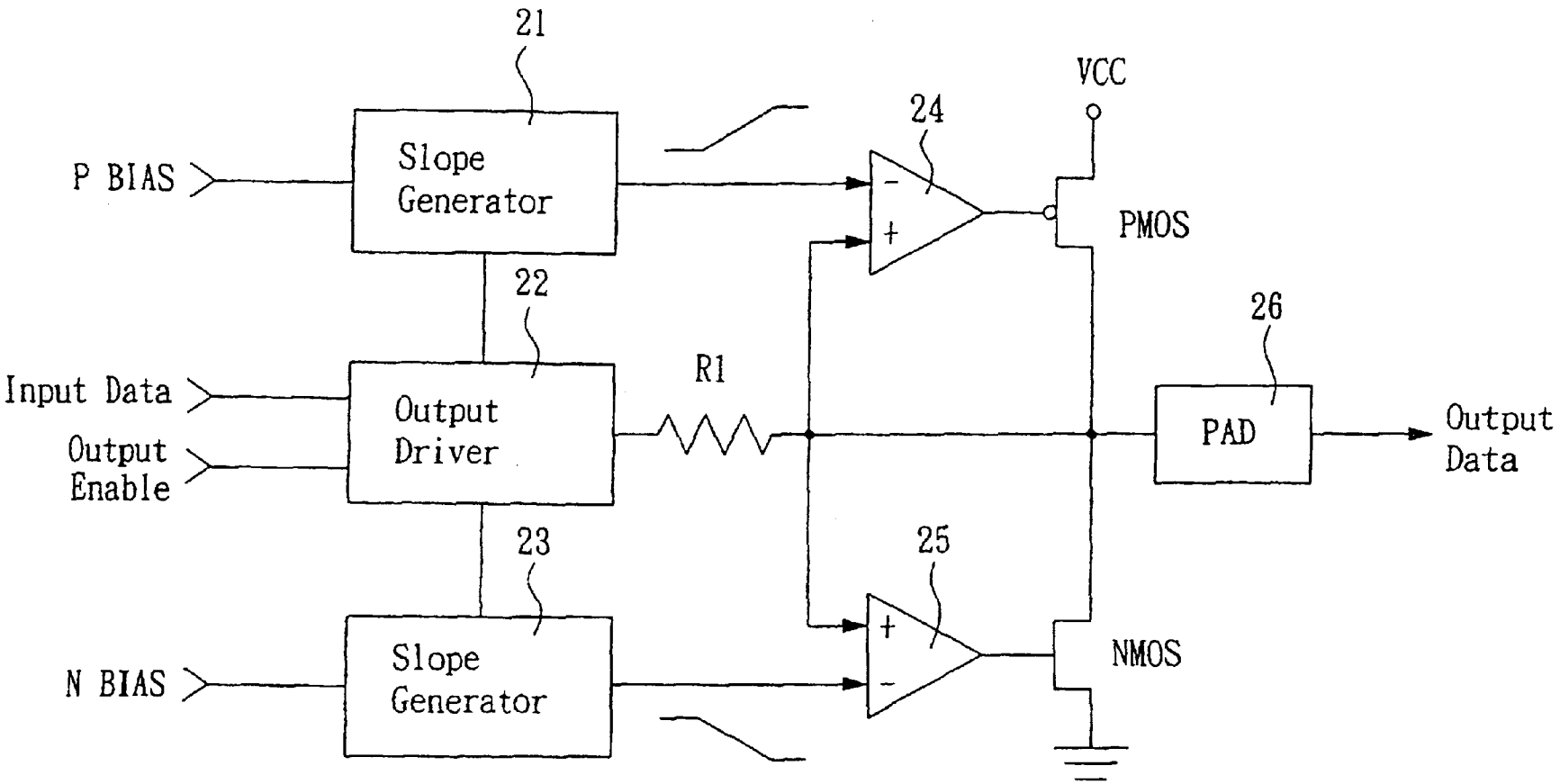
FIG. 2 (PRIOR ART)
FIG. 2 is a schematic block diagram showing another conventional output control circuit in accordance with the prior art.
Figure 3:
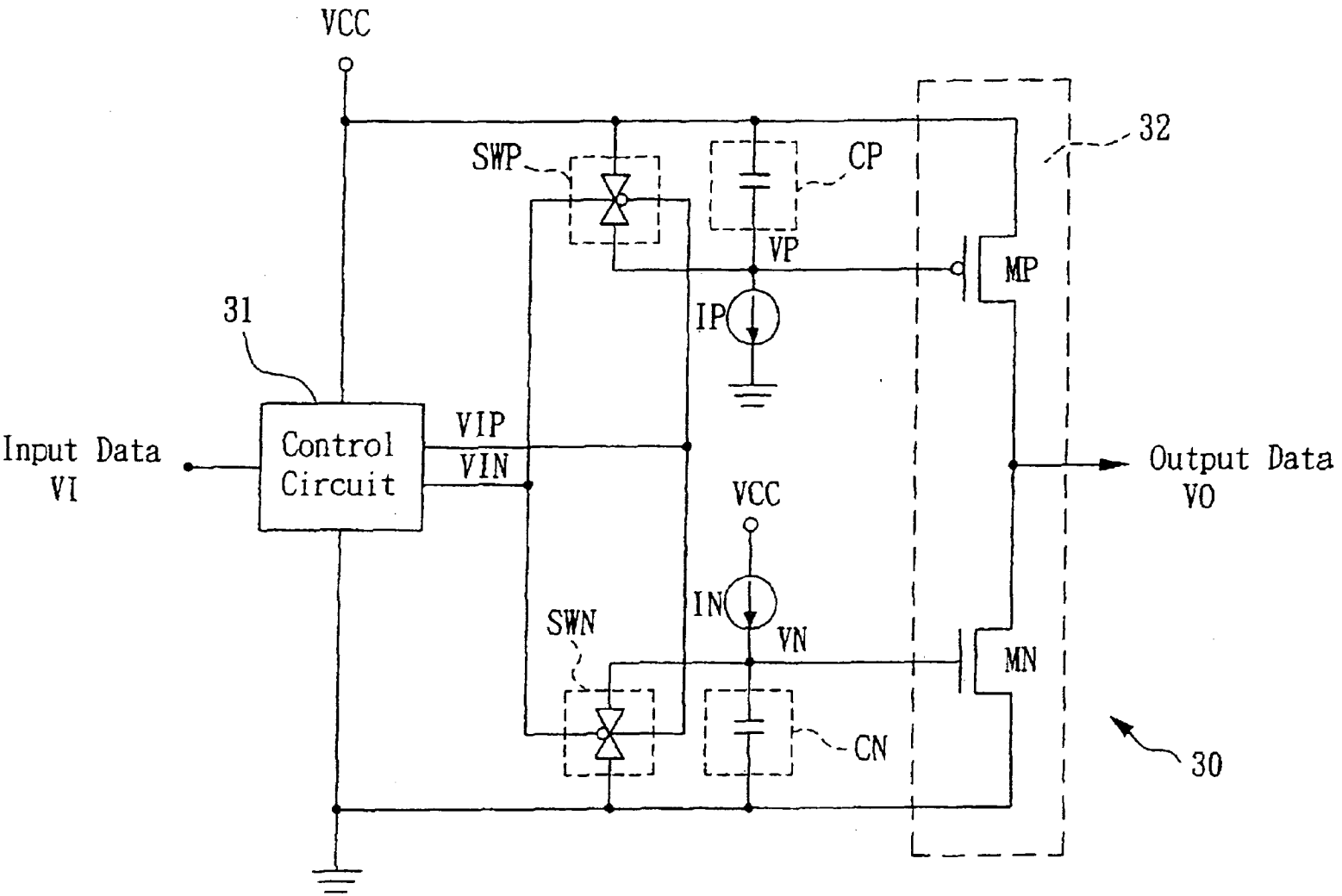
FIG. 3 is a schematic block diagram showing the output circuit for adjusting output voltage slew rate in accordance with the first embodiment of the present invention.

Please refer to FIG. 3, which is a schematic block diagram of the first embodiment showing an output circuit for adjusting output voltage slew rate in accordance with the present invention. In the FIG. 3, the output circuit 30 for adjusting output voltage slew rate of the present invention comprises a control circuit 31, a first switch SWP, a first capacitor CP, a first current source IP, a second switch SWN, a second capacitor CN, a second current source IN and a output control device 32.

Figure 4A:
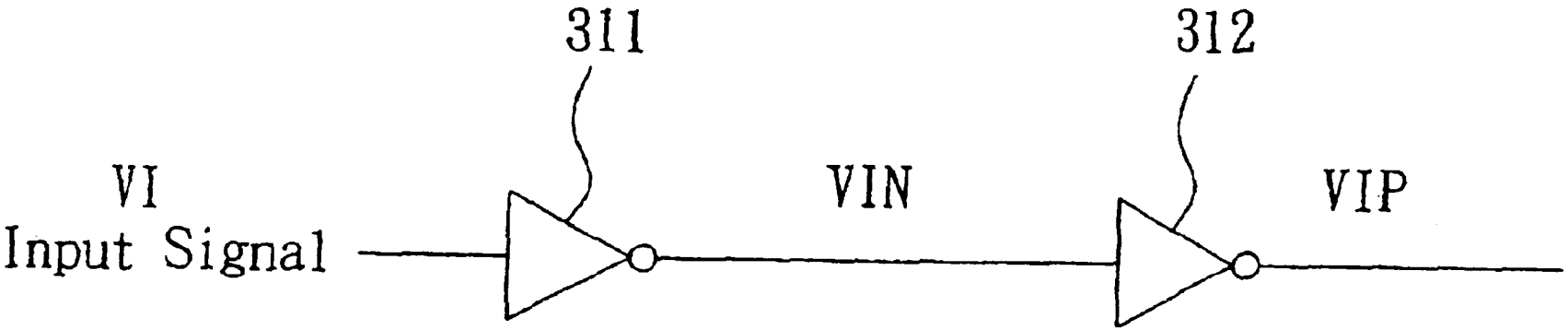
FIG. 4A is a diagram showing an embodiment of the control circuit in FIG. 3.

The control circuit 31 generates a first set of control signal VIP and VIN based on an input data VI, meanwhile, the relationship of the control signals VIP and VIN are inverted. In the present invention, when the input data VI is HIGH, the control signal VIP is HIGH and the control signal VIN is LOW. The control signals VIP and VIN are used to control the operation of the first switch SWP and the second switch SWN. That is, when the input data VI is HIGH, the first switch SWP is turn off, and the second switch is turned on. FIG. 4A is a diagram of an embodiment of the present invention that shows a control circuit 31. As shown in FIG. 4A, the control circuit 31 will invert the input signal VI to the control signal VIN with the inverter 311, and will also invert the control signal VIN to the control signal VIP with the inverter 312. Therefore, the operation of the switches SWP and SWN will be controlled by the control signals VIP and VIN. Of course, the control signals VIP and VIN may not be synchronized in order to control the operation of the first switch SWP and the second switch SWN at different point of time.

Figure 4B:
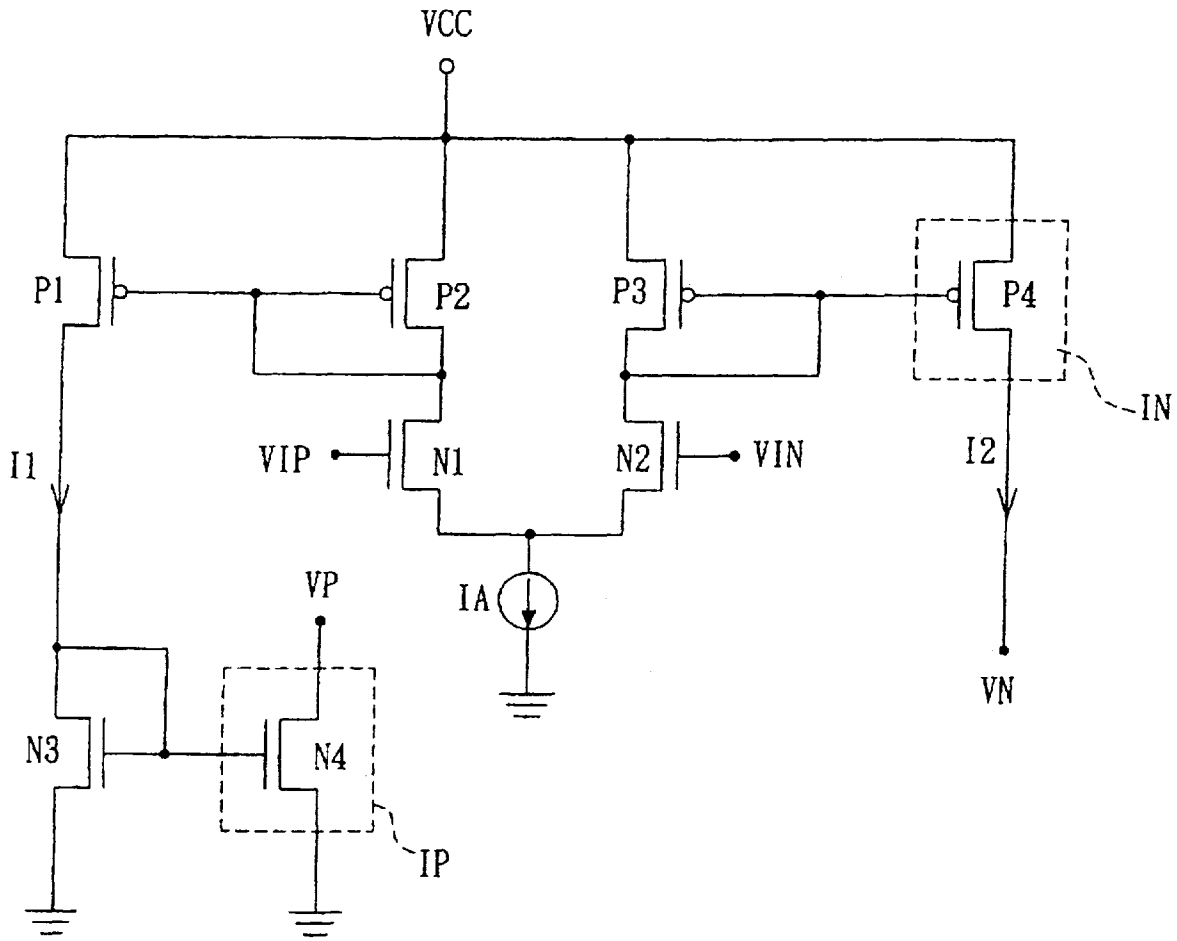
FIG. 4B is a diagram showing an embodiment of the first current source and the second current source in FIG. 3.

FIG. 4B is a diagram of the embodiment for the first current source IP and the second current source IN. As shown in the figure, when the input data VI is HIGH, the control signal VIP is HIGH and the control signal VIN is LOW, at this moment, transistor N1 is conductive while the transistor N2 is not conductive. Since the transistors P1 and P2 form a current mirror, the drain of the transistor P1 will generate the current I1 in proportion to the current IA. Moreover, the current I1 going through the transistor N3 will generate a current on the drain of the transistor N4. So, the transistor N4 can be used as the current source IP. In addition, when the input data VI is LOW, the control signal VIP is LOW and the control signal VIN is HIGH, at this moment, the transistor N1 is not conductive and the transistor N2 is conductive. Since the transistors P3 and P4 form a current mirror, the drain of the transistor P4 will generate the current I2 in proportion to the current IA. So, the transistor P4 can be used as the current source IN.

The first capacitor device CP is charged by the first current source IP, and discharged when the first switch SWP is conductive. The first capacitor device CP provides a first control voltage VP. The second capacitor device CN is charged by the second current source IN, and discharged when the second switch SWN is conductive. The second capacitor device CN provides a second control voltage VN. The output control device 32 is made by a first field effect transistor (FET) MP connected in scries with a second field effect transistor (FET) MN, and the point of the connection outputs an output signal VO. The gate of the first field effect transistor is controlled by the first control voltage VP and the second field effect transistor (FET) MN is controlled by the second control voltage VN.

The followings illustrate the operation of the output circuit 30. First, when the input data VI is HIGH, the control signal VIP is HIGH and the control signal VIN is LOW, at this moment, the first switch SWP is OFF and the second switch SWN is ON. Therefore, the first capacitor device CP is charged by the first current source TP and the second capacitor device CN is discharged by the second switch SWN. The present invention adopt resistors with proper electric property for the first switch SWP and the second switch SWN, which makes the time constant of discharging of the capacitor CP and CN is much less than the one of charging. That is, in such circumstance; the second field effect transistor MN will go off first, after that the first field effect transistor MP will go on, which eliminates the situation that the first field effect transistor MP and the second field effect transistor MN conduct simultaneously so as to avoid the short-circuit current. Thus, the output signal VO will go first floating status and change to HIGH.

Second, when the input data VI is LOW, the control signal VIP is LOW and the control signal VIN is HIGH. At this moment, the first switch SWP is ON and the second switch SWN is OFF. Therefore, the first capacitor device CP is discharged by the first switch SWP and the second capacitor device CN is charged by the second current source IN. Since the lime constant of discharging of die capacitor CP and CN is much less than the one of charging. That is, in such circumstance, the first field effect transistor MP will go OFF first, then the second field effect transistor MN will go ON, which eliminates the situation that the first field effect transistor MP and the second field effect transistor MN conduct simultaneously so as to avoid the short-circuit current. So, the output signal VO will go first floating status and change to LOW.

Since the time that the field effect transistors MP and MN of the output control device 32 need for ON and OFF is relevant to the voltage of the gate thereof, therefore, controlling the change of the voltage of the gate will control the output voltage slew rate of the field effect transistors MP and MN. In other words, when the change of the voltage of the gate is getting bigger, the output voltage slew rate is going higher, and on the other hand, the change of the voltage of the gate is getting smaller, the output voltage slew rate is going lower. Thus, by adjusting the time constant of charging, the present invention controls the output voltage slew rate of the output control device 32, and the time constant of charging can be determined by the current of the first current source IP and the first capacitor device CP. Basically, when the current of the first current source IP is getting bigger, or when the capacitance of the first capacitor device CP is getting smaller, the time constant of charging is going smaller, which causes the change of the voltage of the gate to go bigger and further makes the output voltage slew rate go higher. However, when the current of the first current source IP is getting smaller, or when the capacitance of the first capacitor device CP is getting bigger, the time constant of charging is going bigger, which causes the change of the voltage of the gate goes smaller and further makes the output voltage slew rate go lower. Obviously, from above, the output voltage slew rate can be controlled properly by controlling the current of the first current source IP and the capacity of the first capacitor device CP.

Figure 5:
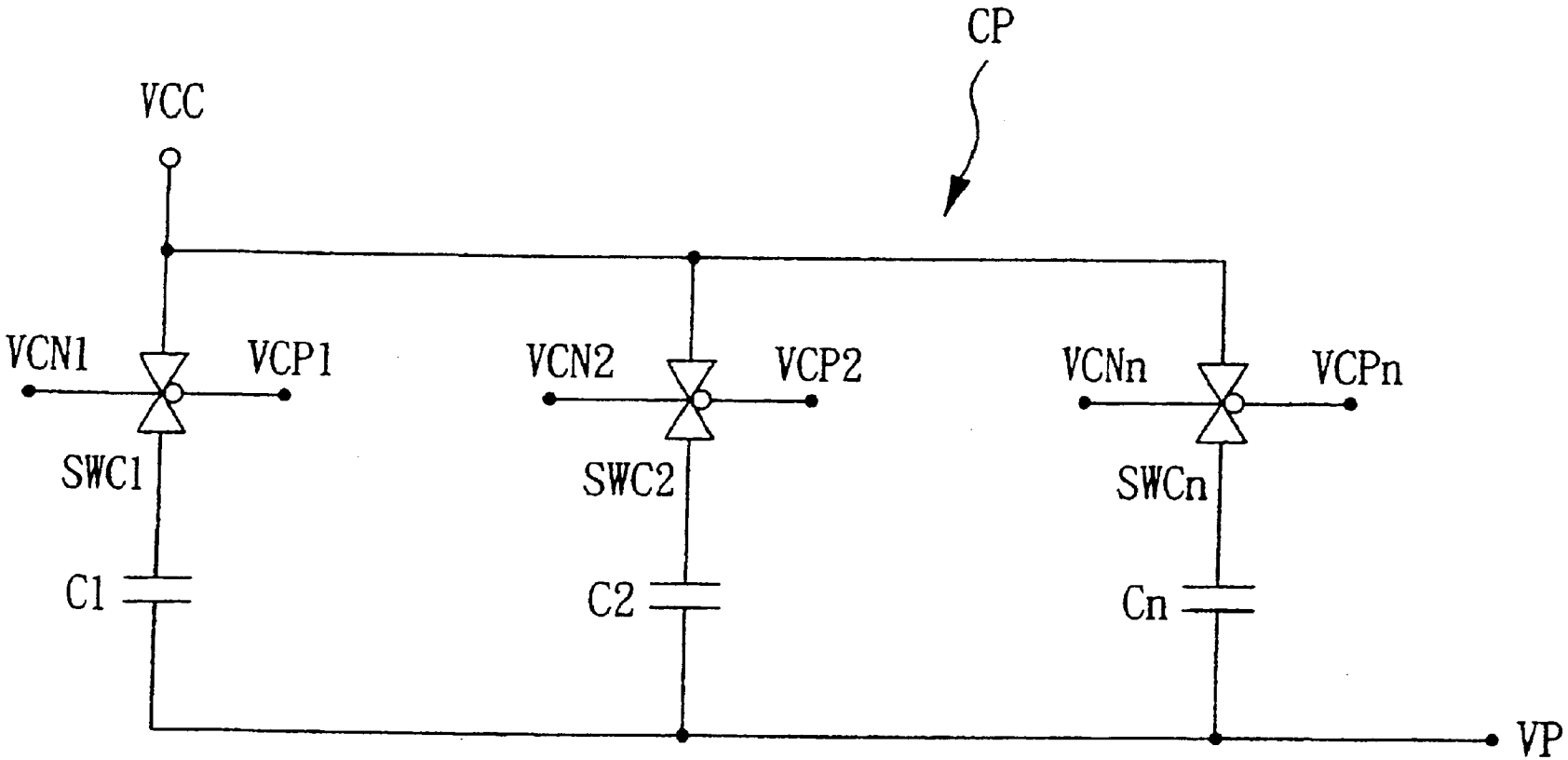
FIG. 5 is a diagram showing an embodiment of the first capacitor device CP in FIG. 3.

FIG. 5 is a diagram showing an embodiment of how to control the capacitance of the first capacitor device CP. As shown in the figure, the first capacitor device CP consists of n sets of capacitor, C1 to Cn, connected in parallel, and each capacitor (C1 to Cn) is controlled by corresponding switch SWC1 to SWCn respectively. Meanwhile, each switch (SWC1 to SWCn) is controlled by each control signal VCN1, VCP1 to VCNn and VCPn respectively. Thus, the control signals VCN1 to VCNn, VCP1 to VCPn will be used to control the capacitance of the first capacitor device CP and further will be used to control the output voltage slew rate of the output signal VO. For example, the more the switch SWC1 to SWCn is ON, the bigger the capacitance of the first capacitor device CP is, which means the output voltage slew rate is getting lower. In addition, the way of controlling the second capacitor device CN is similar to the one controlling the first capacitor device CP in FIG. 5, the extra explanation will not be necessary.

Figure 6:
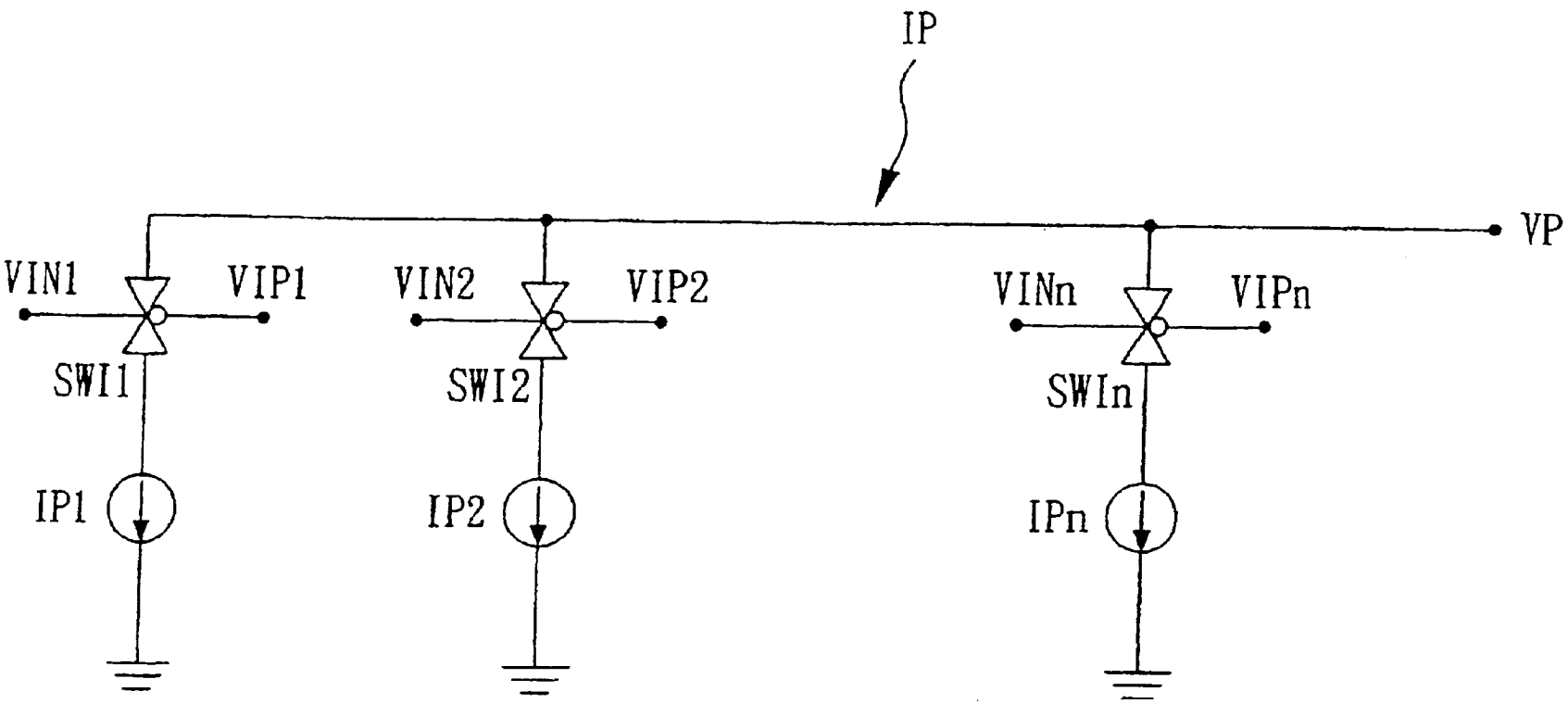
FIG. 6 is a diagram showing an embodiment of the first current source IP in FIG. 3.

FIG. 6 shows an embodiment of how to control the current of the first current source IP. As shown in the figure, the first current source IP consists of n sets of current source, IP1 to IPn, connected in parallel, and each current source (IP1 to IPn) is controlled by corresponding switch SWI1 to SWIn respectively. Meanwhile, each switch (SWI1 to SWIn) is controlled by each control signal VIN1, VIP1 to VINn and VTPn respectively. Thus, the control signals VIN1 to VINn, VIP1 to VIPn will be used to control the current of the first current source IP and further will be used to control the output voltage slew rate of the output signal VO. For example, the more the switch SWI1 to SWIn is ON, the bigger the current of the first current source IP is, which means the output voltage slew rate is getting higher. The way of controlling the second current source IN is similar to the one controlling the first current source IP in FIG. 6, the extra explanation will not be necessary.

Figure 7:
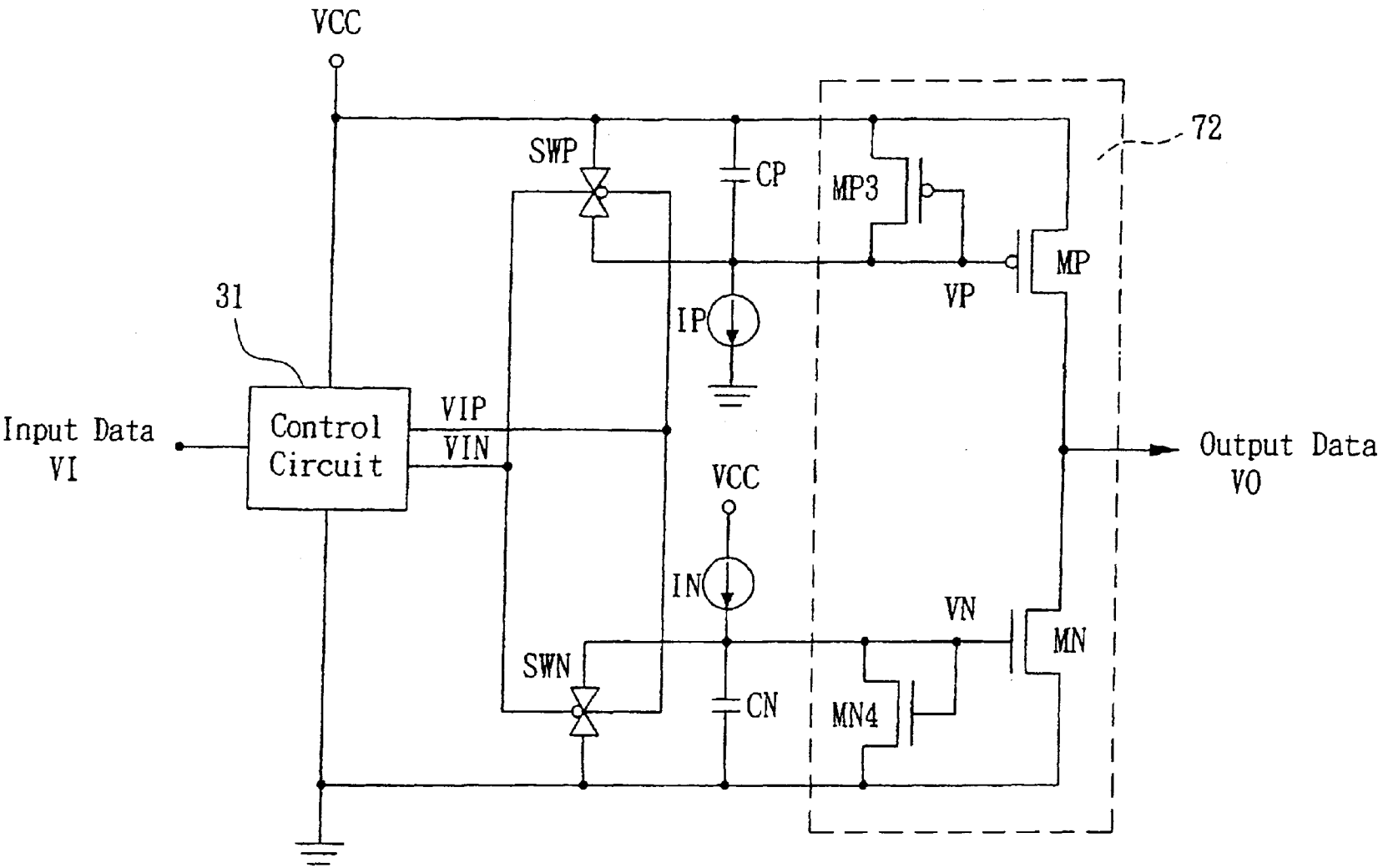
FIG. 7 is a schematic block diagram showing the output circuit for adjusting output voltage slew rate in accordance with the second embodiment of the present invention.

FIG. 7 is a schematic block diagram showing the output circuit for adjusting output voltage slew rate in accordance with the second embodiment of the present invention. As shown in figure, the second embodiment differs from the first embodiment is that the output control device 72 is not only connected the first field effect transistor MP and the second field effect transistor MN but also connected the third field effect transistor MP3 and the fourth field effect transistor MN4. The output circuit illustrated in the first embodiment is able to adjust the output voltage slew rate and will avoid the short-circuit current while the output circuit in the second embodiment is more than that but also is able to control the volume of output current.

As shown in FIG. 7, the third field effect transistor MP3 and the first field effect transistor MP form a current mirror. Therefore, when the voltage of gate of the first field effect transistor MP is charged to a steady level, the ratio of the conducted current of the first field effect transistor MP, Imp, over the current of the first current source IP, Idn, is almost equal to the aspect ratio of the first field effect transistor MP to the third field effect transistor MP3, which is shown as follows, $$Imp/Idn=(W_{MP}/L_{MP})/(W_{MP3}/L_{MP3}) \quad \text{Formula (1).}$$

Similarly, the ratio of the conducted current of the second field effect transistor MN, Imn, over the current of the second current source IN, Iup, is almost equal to the aspect ratio of the second field effect transistor MN to the fourth field effect transistor MN4, which is shown as follows, $$Imn/Iup=(W_{MN}/L_{MN})/(W_{MN4}/L_{MH4}) \quad \text{Formula (2).}$$

Thus, with the proper designed aspect ratio for the first field effect transistor MP over the third field effect transistor MP3 and that for the second field effect transistor MN over the fourth field effect transistor MN4, the output current of the output control device 72 will be under controlled.

Figure 8:
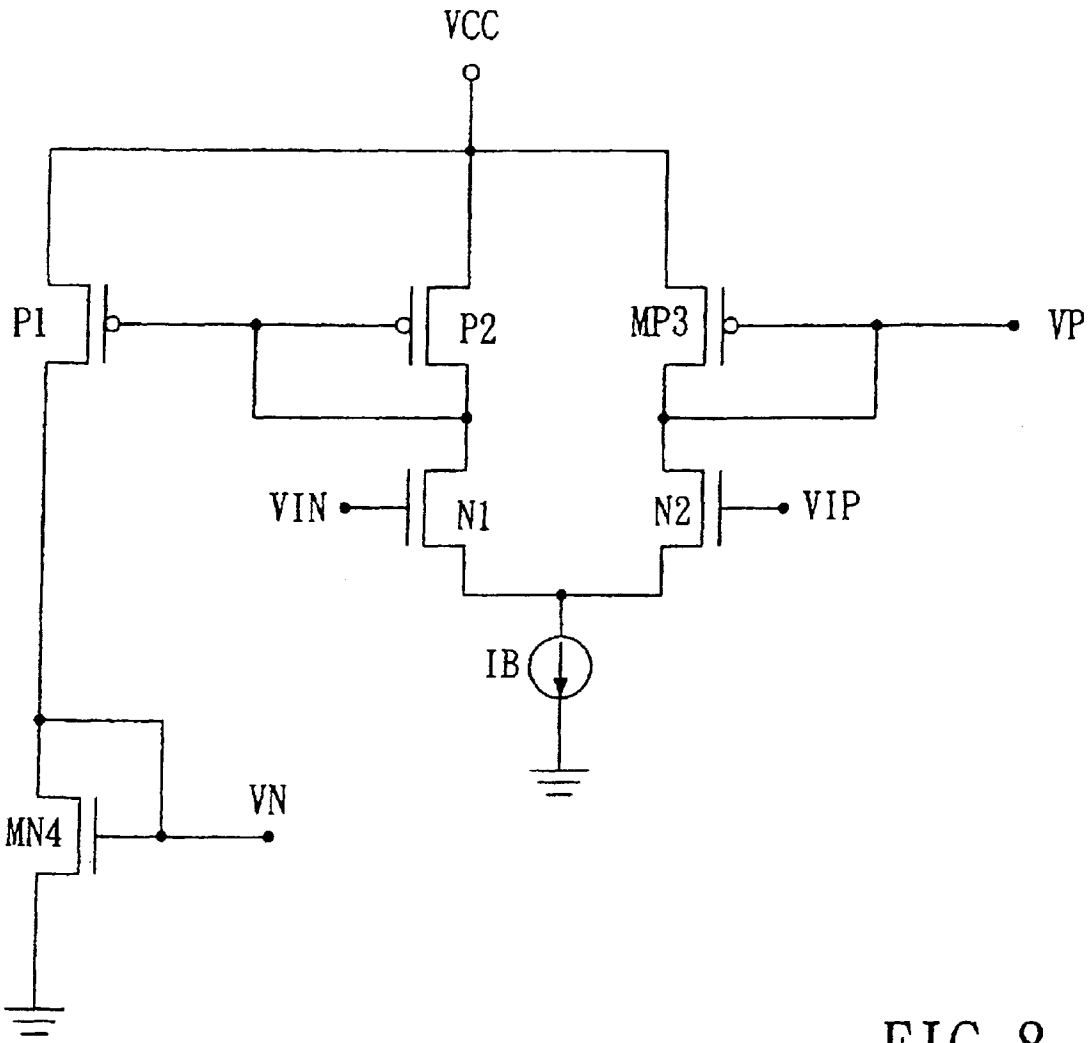
FIG. 8 is a diagram showing an embodiment of the first current source and the second current source in FIG. 7.

FIG. 8 illustrates an embodiment for the first current source IP, the second current source IN, the transistor MP3 and the transistor MN4 in FIG. 7. As shown, when the input data V1 is HIGH, the control signal VIP is HIGH and the control signal V1N is LOW, the transistor N1 is not conductive and the transistor N2 is conductive. At this moment, the current source IB is regarded as the current source IP. Moreover, when the input data VI is LOW, the control signal VIP is LOW and the control signal VIN is HIGH, the transistor N1 is conductive and the transistor N2 is not conductive. Since the transistor P1 and P2 is a current mirror, the drain of the transistor P1 will generate a current in proportion to the current of the current source IB, so the transistor P1 can be regarded as the current source IN.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

[1. An output circuit for adjusting output voltage slew rate, comprising:

a control circuit, for receiving an input data and generating a first control signal based on the input data;

an output control device consisting of a first transistor connected in series with a second transistor and a connection is an output end for generating an output signal;

a first capacitor device having a first end and a second end, the first end is connected to a first working voltage and generates a first control voltage by charging/discharging on the second end to control a gate of the first transistor;

a first switch for controlling charging/discharging of the first capacitor device based on the first control signal;

a first current source for providing charging current for the first capacitor device;

a second capacitor device having a first end and a second end, the second end is connected to a second working voltage and generates a second control voltage by charging/discharging on the first end to control a gate of the second transistor;

a second switch for controlling charging/discharging of the second capacitor device based on the first control signal; and a second current source providing charging current for the second capacitor device.]

[2. The output circuit of claim 1, wherein the first capacitor device is a single capacitor.]

[3. The output circuit of claim 1, wherein the second capacitor device is a single capacitor.]

4. [The output circuit of claim 1.] *An output circuit for adjusting output voltage slew rate, comprising:*

*a control circuit, for receiving an input data and generating a first control signal based on the input data;*

*an output control device comprising a first transistor coupled in series with a second transistor, wherein a connection is an output end for generating an output signal;*

*a first capacitor device having a first end and a second end, wherein the first end is coupled to a first working voltage and the second end generates a first control voltage to control a gate of the first transistor;*

*a first switch for controlling charging/discharging of the first capacitor device based on the first control signal;*

*a second capacitor device having a first end and a second end, wherein the second end is coupled to a second working voltage and the first end generates a second control voltage to control a gate of the second transistor; and*

*a second switch for controlling charging/discharging of the second capacitor device based on the first control signal;* wherein the first capacitor device [is consistent of] *comprises* a plurality of capacitors [connected] *coupled* in parallel and the plurality of capacitors is controlled by a third switch.

5. The output circuit of claim 4, wherein the second capacitor device [is consistent of] *comprises* a plurality of capacitors [connected] *coupled* in parallel and the plurality of capacitors is controlled by a fourth switch.

6. The output circuit of claim 5, wherein the control circuit generates a second control signal to control the third and fourth switches so as to change the capacitance of the first and second capacitor devices.

7. [The output circuit of claim 1,] *An output circuit for adjusting output voltage slew rate, comprising:*

*a control circuit, for receiving an input data and generating a first control signal based on the input data;*

*an output control device comprising a first transistor coupled in series with a second transistor, wherein a connection is an output end for generating an output signal;*

*a first capacitor device having a first end and a second end, wherein the first end is coupled to a first working voltage and the second end generates a first control voltage to control a gate of the first transistor;*

*a first switch for controlling charging/discharging of the first capacitor device based on the first control signal;*

*a first current source for providing a first charging current for the first capacitor device;*

*a second capacitor device having a first end and a second end, wherein the second end is coupled to a second working voltage and the first end generates a second control voltage to control a gate of the second transistor;*

*a second switch for controlling charging/discharging of the second capacitor device based on the first control signal; and*

*a second current source providing a second charging current for the second capacitor device;* wherein the first current source [is consistent of] *comprises* a plurality of current sources [connected] *coupled* in parallel and the plurality of current sources is controlled by a third switch.

8. The output circuit of claim 7, wherein the second current source [is consistent of] *comprises* a plurality of current sources [connected] *coupled* in parallel and each of the current sources is controlled by a fourth switch.

9. The output circuit of claim 8, wherein the control circuit generates a third set of control signals to control the third and fourth switches so as to control the charging speed of the first and second capacitor device.

10. [The output circuit of claim 1, further comprising] *An output circuit for adjusting output voltage slew rate, comprising:*

*a control circuit, for receiving an input data and generating a first control signal based on the input data;*

*an output control device comprising a first transistor coupled in series with a second transistor, wherein a connection is an output end for generating an output signal;*

*a first capacitor device having a first end and a second end, wherein the first end is coupled to a first working voltage and the second end generates a first control voltage to control a gate of the first transistor;*

*a first switch for controlling charging/discharging of the first capacitor device based on the first control signal;*

*a first current source for providing a first charging current for the first capacitor* device;

*a second capacitor device having a first end and a second end, wherein the second end is coupled to a second working voltage and the first end generates a second control voltage to control a gate of the second transistor;*

*a second switch for controlling charging/discharging of the second capacitor device based on the first control signal;*

*a second current source providing a second charging current for the second capacitor device; and* a third transistor, a gate and a drain of the third transistor are [connected] *coupled* to the gate of the first transistor to control an output current of the first transistor.

11. The output circuit of claim 10, further comprising a fourth transistor, a gate and a drain of the fourth transistor are [connected] *coupled* to the gate of the second transistor to control an output current of the second transistor.

12. The output circuit of claim 11, wherein the first capacitor device [is consistent of] *comprises* a plurality of capacitors [connected] *coupled* in parallel and the plurality of capacitors is controlled by a third switch.

13. The output circuit of claim 12, wherein the second capacitor device [is consistent of] *comprises* a plurality of capacitors [connected] *coupled* in parallel and the plurality of capacitors is controlled by a fourth switch.

14. The output circuit of claim 13, wherein the control circuit generates a second control signal to control the third and fourth switches so as to change the capacitance of the first and second capacitor devices.

15. The output circuit of claim 11, wherein the first current source [is consistent of] *comprises* a plurality of current sources [connected] *coupled* in parallel and the plurality of current sources is controlled by a third switch.

16. The output circuit of claim 15, wherein the second current source [is consistent of] *comprises* a plurality of current sources [connected] *coupled* in parallel and the plurality of current sources is controlled by a fourth switch.

17. The output circuit of claim 16, wherein the control circuit generates a third control signal to control the third and fourth switches so as to control the charging speed of the first and second capacitor devices.

18. An output circuit for adjusting output voltage slew rate, comprising:

a control circuit, for receiving an input data and generating a first control signal and a second control signal based on the input data;

an output control device [consisting of] *comprising* a first transistor [connected] *coupled* in series with a second transistor [and], *wherein* a connection is an output end for generating an output signal;

a first capacitor device having a first end and a second end, *wherein* the first end is [connected] *coupled* to a first working voltage and *the second end* generates a first control voltage [by charging/discharging on the second end] to control a gate of the first transistor;

a first switch for controlling charging/discharging of the first capacitor device based on the first control signal;

a first current source for providing *a first* charging current for the first capacitor device;

a second capacitor device having a first end and a second end, *wherein* the second end [is connected] *coupled* to a second working voltage and *the first end* generates a second control voltage [by charging/discharging on the first end] to control a gate of the second transistor;

a second switch for controlling charging/discharging of the second capacitor device based on the second control signal; and a second current source for providing *a second* charging current for the second capacitor device;

[adjusting] *wherein the* output voltage slew rate of the output circuit *is adjusted* by adjusting the *dynamically adjustable* time constant of *at least* the first [and] *or* second capacitor devices.

19. The output circuit of claim 18, wherein the first and second control signals are hot synchronized so as to control the first and second capacitor devices to charge/discharge at different point of time.

20. The output circuit of claim 18, wherein the relation of the first and second control signals are inverted.

*21. The output circuit of claim 18, wherein output voltage slew rate of the output circuit is adjusted by adjusting the time constant of both the first and second capacitor devices.*

*22. A method for adjusting a slew rate of an output signal, the method comprising:*

*receiving an input data;*

*generating a control signal according to the input data;*

*respectively providing a first current and a second current to a first capacitor device and a second capacitor device;*

*charging or discharging the first capacitor device to generate a first control voltage according to the control signal;*

*charging or discharging the second capacitor device to generate a second control voltage according to the control signal; and*

*outputting the output signal according to the first control voltage and the second control voltage*

*wherein the slew rate of the output signal is adjusted by adjusting at least one time constant or one capacitance of the first and second capacitor devices or one of the first and second currents dynamically.*

*23. The method of claim 22, wherein the control signal comprises a first and a second control signals, and the first and the second control signals are not synchronized so as to control the first and second capacitor devices to charging/discharging at different point of time.*

* * * * *